United States Patent [19]

Nishizawa et al.

[11] Patent Number: 4,806,321

[45] Date of Patent: Feb. 21, 1989

[54] USE OF INFRARED RADIATION AND AN ELLIPSOIDAL REFLECTION MIRROR

[75] Inventors: Junichi Nishizawa, 6-16, Komegafukuro 1-chome; Hitoshi Abe, 22-11, Midorigaoka 1-chome; Soubei Suzuki, 1-3, Otamayashita, all of Sendai-shi, Miyagi-ken, Japan

[73] Assignees: Research Development Corporation of Japan; Junichi Nishizawa; Hitoshi Abe; Soubei Suzuki, all of Japan

[21] Appl. No.: 759,098

[22] Filed: Jul. 25, 1985

[30] Foreign Application Priority Data

Jul. 26, 1984 [JP] Japan ................. 59-153979

[51] Int. Cl.[4] .............. C30B 35/00; C30B 23/02; C30B 25/14
[52] U.S. Cl. ................. 422/245; 118/725; 156/601; 156/611; 156/613; 156/DIG. 73; 427/54.1; 427/55; 427/248.1; 427/255.1
[58] Field of Search ............. 156/610, 613, 611, 614, 156/601, DIG. 73, DIG. 80; 422/109, 245; 118/725, 729; 427/53.1, 54.1, 87, 86, 55, 248.1, 255.1; 219/411, 409

[56] References Cited

U.S. PATENT DOCUMENTS

| | | | |
|---|---|---|---|
| 3,745,834 | 7/1973 | Velze et al. | 156/601 |
| 3,831,029 | 8/1974 | Jones et al. | 156/601 |
| 4,018,566 | 4/1977 | Zeuch et al. | 156/601 |
| 4,058,430 | 11/1977 | Suntola et al. | 156/611 |
| 4,434,025 | 2/1984 | Robillard | 156/601 |
| 4,558,660 | 12/1985 | Nishizawa et al. | 118/725 |
| 4,565,598 | 1/1986 | Seymour | 156/601 |

OTHER PUBLICATIONS

Nishizawa, Japan Society of Applied Physics, vol. 53, No. 6, 6/84 Translation.
McGraw-Hill Dictionary of Scientific and Technical Terms, 3rd Ed., N.Y., 1984, p. 1301.
Guro et al., Sov. Phys., No. 11 (1978), pp. 22-26.
Moore, Walter J., Physical Chemistry, Third Edition, Prentice Hall, Englewood Cliffs, N.J., 1962, pp. 463-465.

Primary Examiner—Gary P. Straub
Attorney, Agent, or Firm—Darby & Darby

[57] ABSTRACT

In a semiconductor crystal growth apparatus, a growth vessel enclosing a substrate is evacuated to an ultrahigh vacuum, and gas molecules containing a component element of a semiconductor which should grow on the substrate is introduced according to a predetermined time sequence into the growth vessel from an external gas source. Infrared radiation from an infrared radiation emitting lamp associated with the growth vessel and controlled by a temperature control unit is directed toward and onto the substrate whose temperature is to be maintained at a predetermined setting. Crystal growth of one molecular layer after another can be achieved by the apparatus with dimensional accuracy of the thickness of a single molecular layer.

18 Claims, 4 Drawing Sheets

USE OF INFRARED RADIATION AND AN ELLIPSOIDAL REFLECTION MIRROR

FIELD OF THE INVENTION

This invention relates to an apparatus for forming a crystal of a semiconductor, which is suitable for formation of a semiconductor crystal growth layer with precision as precise as a single molecular layer.

DESCRIPTION OF THE PRIOR ART

A metal-organic chemical vapor deposition process (referred to hereinafter as an MO-CVD process) and a molecular beam epitaxy (referred to hereinafter as an MBE process) are well known in the art as vapor phase epitaxial techniques for forming a crystalline thin film of a semiconductor. According to the MO-CVD process, elements of the III and V groups, which are sources, and hydrogen or like gas, which is a carrier, are simultaneously introduced into a reaction chamber to cause growth of a crystal by means of thermal decomposition. However, the thermal decomposition results in a poor quality of the crystal layer formed by growth. The MO-CVD process is also defective in that difficulty is encountered for controlling the thickness of the layer with precision as precise as a single molecular layer.

On the other hand, the MBE process is well known as a crystal growth process making use of a ultrahigh vacuum. This process, however, includes physical adsorption as its first step. Therefore, the quality of the crystal is inferior to that provided by the CVD process which makes use of a chemical reaction. For the growth of a III-V compound semiconductor such as GaAs according of the MBE process, such elements of the III and V groups are used as sources, and the sources themselves are disposed in a growth chamber. Therefore, it is difficult to control the amount of gases produced by heating the sources, to control the rate of vaporization of the sources and to replenish the sources, resulting in difficulty of maintaining a constant growth rate for a long period of time. Further, the evacuating device exhausting, for example, the vaporized matters becomes complex in construction. Furthermore, it is difficult to precisely control the stoichiometric composition of the composed semiconductor. Consequently, the MBE process is defective in that a crystal of high quality cannot be obtained.

SUMMARY OF THE INVENTION

It is a primary object of the present invention to provide an apparatus for forming a crystal of a semiconductor, which can cause growth of a high-quality crystal layer of high purity on a substrate with precision as precise as a single molecular layer.

In accordance with one aspect of the present invention, there is provided an apparatus for forming a crystal of a semiconductor, comprising a growth vessel enclosing a substrate, evacuating means for evacuating the interior of the growth vessel to a ultrahigh vacuum, nozzle means connected to external gas sources for introducing gaseous molecules containing those of component elements of a crystal which should grow on the substrate disposed in the growth vessel, infrared radiation emitting means for emitting and directing infrared radiation toward and onto the substrate, a radiation pyrometer detecting the temperature of the substrate, and temperature control means for controlling the infrared radiation emitting means thereby controlling the temperature of the substrate on the basis of a temperature feedback signal applied from the radiation pyrometer.

Thus, according to the first feature of the present invention, the heat source for heating the substrate is disposed outside the growth vessel evacuated to an ultrahigh vacuum so as to eliminate, from the interior of the growth vessel, members including a heater unnecessary for the crystal growth, so that unnecessary gases including gas of a heavy metal resulting from heating by the internal heater are not produced, and growth of a high-purity crystal can be achieved. Further, by virtue of the use of the radiation pyrometer as a means for detecting the internal temperature of the growth vessel, contactless detection of the temperature can be achieved. Therefore, an element such as thermocouple tending to be attacked by a reactive gas is eliminated to extend the useful service life of the temperature detector, and liberation of extra gases including gas of a heavy metal due to direct heating cannot occur, so that growth of a high-purity crystal can be achieved from this point too.

In addition to the first feature described above, it is a second feature of the present invention that an ellipsoidal reflection mirror is provided for focusing the infrared radiation, emitted from the infrared radiation emitting means, onto the substrate.

According to this second feature, the substrate can be efficiently heated without wasteful consumption of energy, so that the temperature of the substrate can be accurately controlled.

Other objects and features of the present invention will become more apparent from the following detailed description taken in conjunction with the accompanying drawings.

DESCRIPTION OF THE PREFERRED EMBODIMENTS

Before describing the present invention in detail, the construction and operation of a prior art, semiconductor crystal forming apparatus developed previously by the inventors will be briefly described for a better understanding of the present invention.

Figure 1:
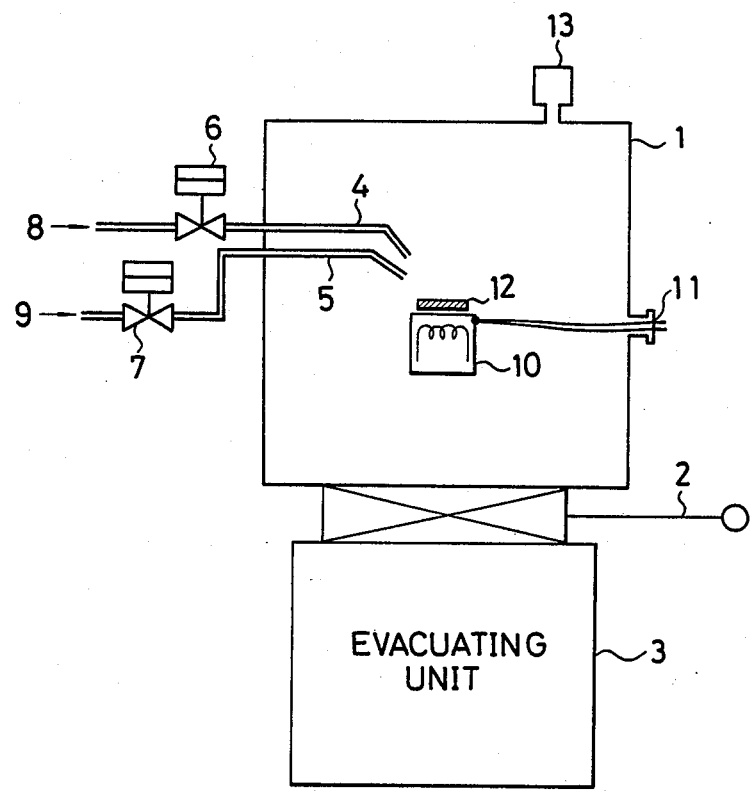
FIG. 1 is a diagrammatic view showing the construction of a prior art, semicondutor crystal forming apparatus developed previously by the inventors.

Referring to FIG. 1, a crystal growth vessel 1 is made of a metal such as stainless steel. The vessel 1 is coupled through a gate valve 2 to an evacuating unit 3 which evacuates the interior of the vessel 1 to an ultrahigh vacuum. Nozzles 4 and 5 extend into the crystal growth vessel 1 for introducing gaseous compounds containing component elements of the III and V groups respectively thereby causing growth of a III-V compound semiconductor on a substrate 12 disposed in the crystal growth vessel 1. The nozzles 4 and 5 are provided with on-off valves 6 and 7 controlling the introduced amounts of the gaseous compounds 8 and 9 containing the component elements of the III and V groups respectively. A heater 10 for heating the substrate 12 is disposed in the growth vessel 1, and a thermocoupled 11 is associated with the heater 10 for measuring the temperature of the substrate 12. The heater 10 includes a tungsten filament sealed in a quartz glass tube, and the substrate 12 of a compound semiconductor is mounted on the heater 10. A pressure gauge 13 for measuring the value of the internal vacuum is disposed on the growth vessel 1.

A monocrystalline thin film of a compound semiconductor is formed in a manner as described hereinunder by the crystal forming apparatus having the construction shown in FIG. 1. Suppose, for example, the case of epitaxial growth of a single crystal of GaAs on the substrate 12 of GaAs. First, the growth vessel 1 is evacuated to a vacuum of about $10^{-7}$ to $10^{-8}$ Pascal (abbreviated hereinafter as Pa) by opening the gate valve 2 and operating the ultrahigh-vacuum evacuating unit 3. Then, the GaAs substrate 12 is heated up to 300° to 800° C. by the heater 10, and gaseous TMG (trimethyl gallium) 8 is introduced, as gas containing Ga, into the growth vessel 1 by holding the valve 6 open for 0.5 to 10 sec and maintaining the internal pressure of the growth vessel at $10^{-1}$ to $10^{-7}$ Pa. After closing the valve 6 and exhausting the gas from within the growth vessel 1, gaseous $AsH_3$ (arsine) 9 is introduced, as gas containing As, into the growth vessel 1 by holding the valve 7 open for 2 to 200 sec and maintaining the internal pressure of the growth vessel 1 at $10^{-1}$ to $10^{-7}$ Pa. As a result, at least one molecular layer of GaAs grows on the substrate 12.

Thus, according to the crystal growth apparatus proposed previously by the inventors, growth of a monocrystalline thin film of GaAs having a desired thickness can be attained with precision as precise as a single molecular layer, by repeating the process of growth of the monomolecular layer in the manner described above. However, due to the provision of the substrate heater 10 in the growth vessel 1 of the semiconductor crystal growth apparatus, extra gases of elements including a heavy metal emanate as a result of heating by the heater 10, resulting in difficulty of obtaining a good-quality crystal having a high purity.

With a view to solve the above problem, the present invention provides an improved semiconductor crystal growth apparatus which can attain growth of a single crystal of a semiconductor having a better purity.

Figure 2:
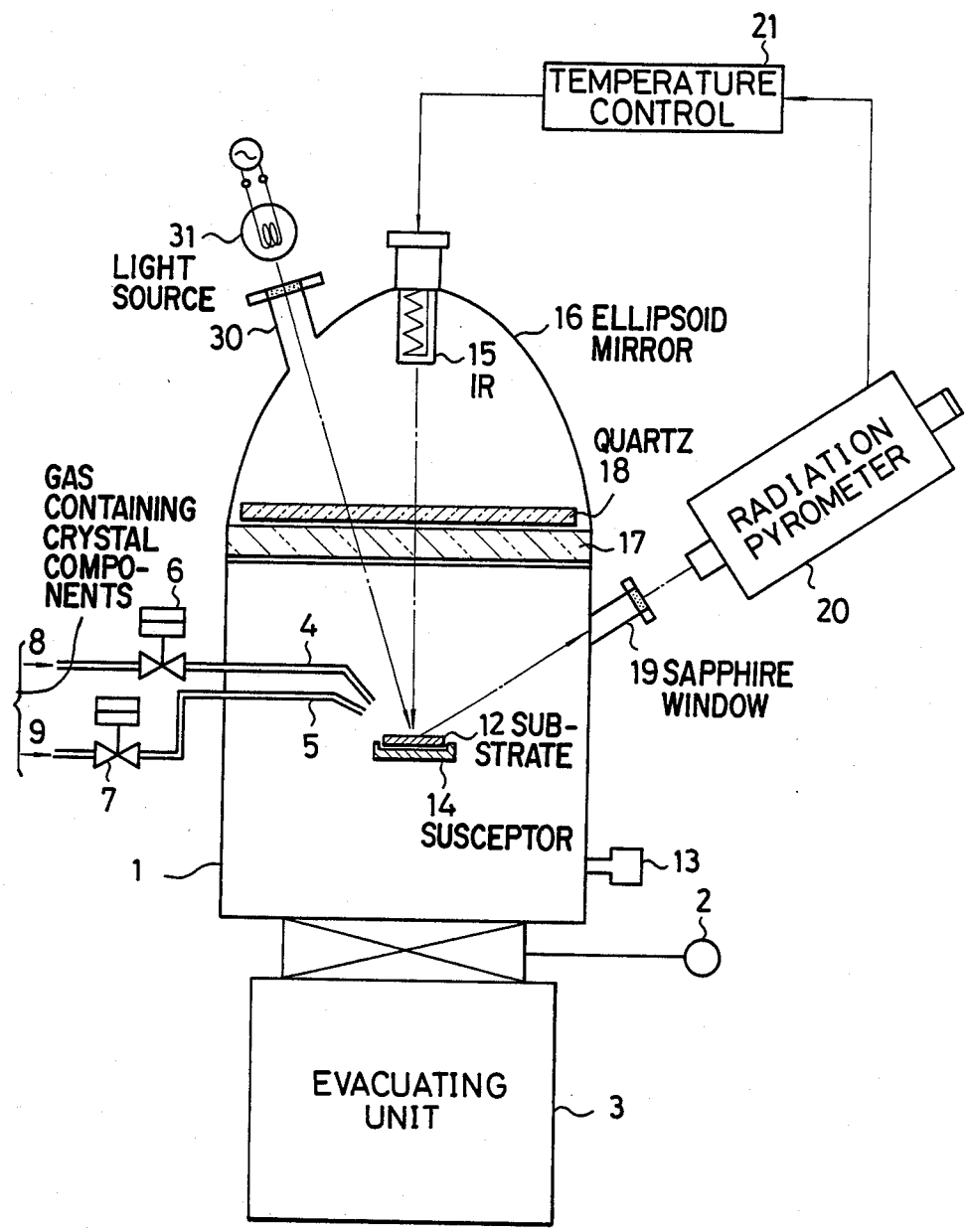
FIG. 2 is a diagrammatic view showing the construction of an embodiment of the semiconductor crystal forming apparatus according to the present invention.

FIG. 2 shows one of most preferred embodiments of the present invention, and, in FIG. 2, the same reference numerals are used to designate the same or equivalent parts appearing in FIG. 1 to dispense with repeated description of such parts. Parts different from those shown in Fig. 1 will now be described.

Referring to FIG. 2, the GaAs substrate 12 is supported on a susceptor 14 formed of quartz alone. A quartz plate 17 permitting transmission of infrared radiation forms the upper part of the growth vessel 1, the interior of which is maintained at the ultrahigh vacuum. An infrared emitting lamp 15 acting as a heat source is disposed above the quartz plate 17, and the space above the quartz plate 17 is covered with an ellipsoidal mirror 16 so that the infrared radiation emitted from the lamp 15 can be efficiently condensed or focused onto the substrate 12. A glass plate 18 is disposed directly above the quartz plate 17 so that the radiation having a wavelength longer than 3 μm in the radiation emitted from the lamp 15 can be shielded by the glass plate 18. Further, the ellipsoidal mirror 16 may be provided with an optical system 30 and an associated light source 31 which directs light having a specific wavelength onto the substrate 12. The details of such an arrangement will be described later.

In order that the temperature of the substrate 12 can be indirectly measured without the use of a thermocouple, a window of sapphire 19 is associated with the growth vessel 1 to permit transmission therethrough of light radiated from the substrate 12, and the light radiated from the substrate 12 is measured by a radiation pyrometer 20. A signal indicative of the value of the temperature measured by the radiation pyrometer 20 is applied to a temperature control unit 21, and the deviation of the measured temperature value from a desired value is subjected to a proportional plug integral plug derivative computation in the temperature control unit 21, the resultant value being used for controlling the output of the lamp 15.

Figure 3:
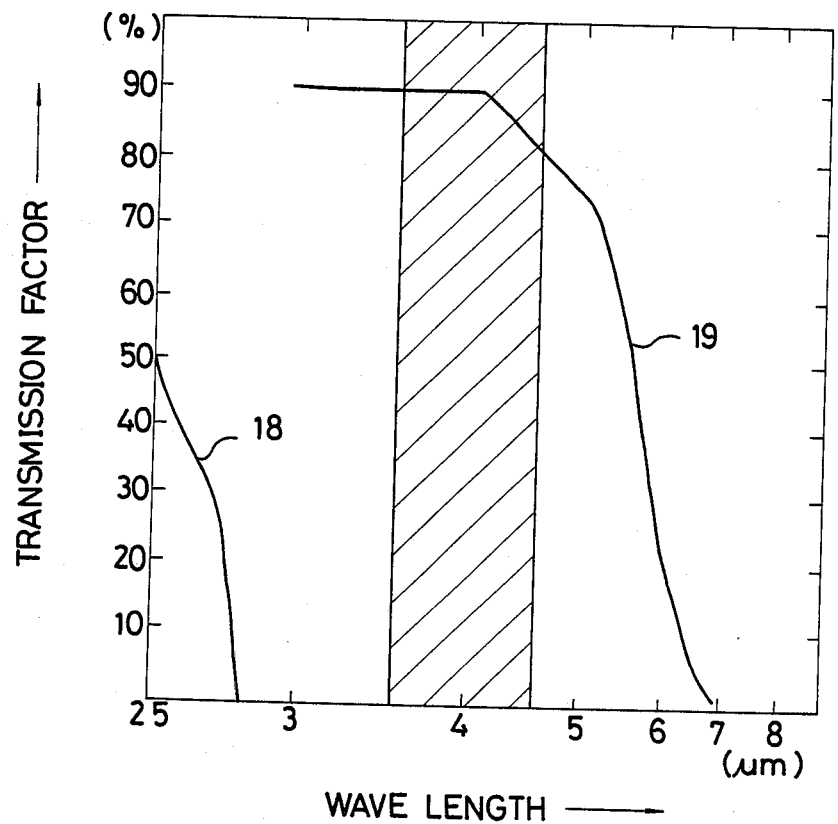
FIG. 3 is a graph showing the relation between the wavelength and the transmission factors of the sapphire window and the glass plate shown in FIG. 2.

FIG. 3 is a graph showing the relation between the wavelength and the transmission factors of the glass plate 18 and the sapphire window 19. It will be seen from FIG. 3 that the sapphire window 19 permits transmission of almost 80% of the radiation having a wavelength up to about 4.5 μm, while, on the other hand, the glass plate 18 shields radiation having a wavelength up to about μm. Therefore, when the temperature-detecting wavelength band of the radiation pyrometer 20 is selected to lie within the hatched range in FIG. 3, the radiation pyrometer 20 can accurately detect the temperature of the substrate 12 without being adversely affected by the waves reflected from the substrate 12 to which the radiation from the lamp 15 is directed, since the pyrometer 20 receives only those components which are radiated from the substrate 12.

In the operation of the apparatus having the construction described above, the radiation pyrometer 20 is so adjusted to receive the light radiated from the surface of the substrate 12, and a data indicative of the desired temperature of the substrate 12 is set in the temperature control unit 21. The temperature of the substrate 12 measured by the radiation pyrometer 20 is compared with the temperature setting in the temperature control unit 21, and the difference or error is subjected to the P.I.D. computation, the resultant signal being applied to the driver for the lamp 15. As a result, the lamp 15 operates to generate its maximum output, so that the surface temperature of the substrate 12 approaches the temperature setting within a short period of time. For example, the period of time required for raising the temperature of the substrate 12 from the room temperature up to 600° C. is only about 10 sec, and the temperature of the substrate 12 during the process of crystal growth can be maintained to be less than ±5° C. relative to the temperature setting.

The other steps of operation except the lamp heating step are the same as those described with reference to FIG. 1. Suppose now that the gaseous compound 8 containing the element of the III group is $AsH_3$, and the gaseous compound 9 containing the element of the V group is TMG. The gate valve 2 is opened, and the evacuating unit 3 is operated to evacuate the interior of the growth vessel 1 to a vacuum of about $10^{-7}$ to $10^{-8}$ Pa. At this time, the GaAs substrate 12 is heated up to about 300 to 800° C. by the output of the lamp 15. The valve 6 is held open for 0.5 to 10 sec to introduce the TMG gas into the growth vessel 1 while maintaining the internal pressure of the growth vessel 1 at $10^{-1}$ to $10^{-7}$ Pa. After closing the valve 6 and exhausting the gases from within the growth vessel 1, the valve 7 is now held open for 2 to 200 sec to introduce the AsH$_3$ gas into the growth vessel 1 while maintaining the internal pressure of the growth vessel 1 at $10^{-1}$ to $10^{-7}$ Pa.

Consequently, at least one molecular layer of crystalline GaAs grows on the surface of the GaAs substrate 12 in each cycle. This crystal growth layer has a high purity and a good quality, since no heat source is present in the growth vessel 1, and, hence, unnecessary gases of elements including a heavy metal do not generate.

Figure 4:
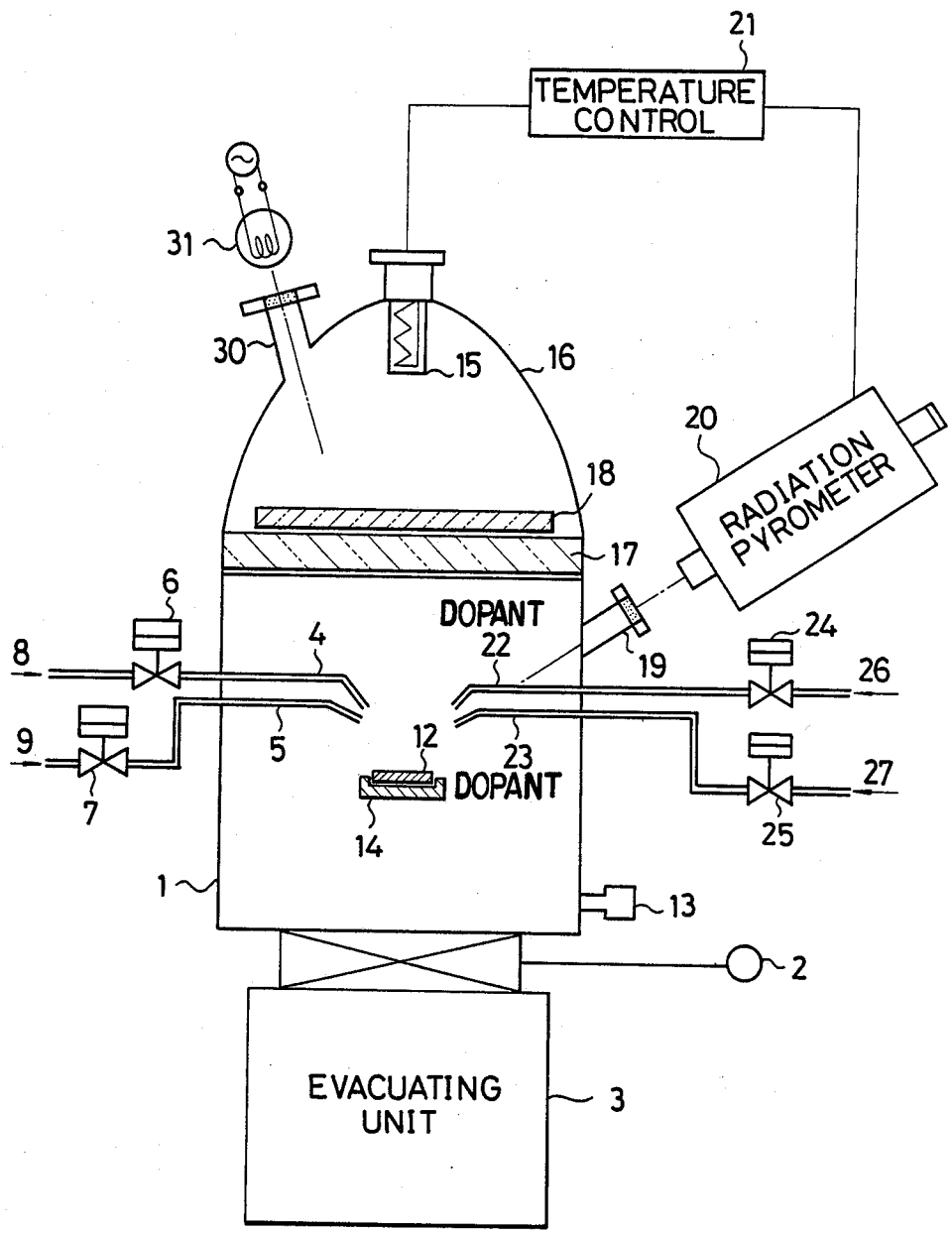
FIG. 4 is a diagrammatic view showing the construction of another embodiment of the present invention.

FIG. 4 shows another embodiment of the present invention which is designed for doping with impurities. Inasmuch as the embodiment shown in FIG. 4 is a modification of that shown in FIG. 2, the same reference numerals are used to designate the same or equivalent parts appearing in FIG. 2. The embodiment shown in FIG. 4 differs from that shown in FIG. 2 in that nozzles 22 and 23 are additionally provided for introducing gaseous compounds for doping with impurities respectively, and on-off valves 24 and 25 are provided on the nozzles 22 and 23 respectively, so that controlled amounts of a gaseous compounds 26 containing an element of the II group and another gaseous compound 27 containing an element of the VI group can be introduced into the growth vessel 1.

Suppose now the case of formation of a p-type growth layer by the apparatus shown in FIG. 4. In this case, three gases, for example, gaseous TMG (trimethyl gallium) 8, gaseous AsH$_3$ (arsine) 9 and gasaeous ZMZn (dimethyl zinc) 26 which is an impurity gas are cyclically introduced into the growth vessel 1. As another method, the TMG gas 8 and ZMZn gas 26 are introduced simultaneously but alternately with the AsH$_3$ gas 9, or the AsH$_3$ gas 9 and ZMZn gas 26 are introduced simultaneously but alternately with the TMG gas 8, for doping with the p-type impurity.

The impurity gas may be ZMCd gas (dimethyl cadmium), ZMMg gas (dimethyl magensium), SiH$_4$ gas (monosilane), GeH$_4$ gas (germane) or the like.

On the other hand, when formation of an n-type growth layer is desired, gaseous ZMSe (dimethyl selenium) 27, which is an impurity gas, gaseous TMG 8 and gaseous AsH$_3$ 9 are cyclically introduced into the growth vessel 1. As another method, TMG gas 8 and ZMSe gas 27 are introduced simultaneously but alternately with AsH$_3$ 9 for doping with the n-type impurity.

The impurity gas may be ZMS gas (diemthyl sulfur), H$_2$S gas (hydrogen sulfide), H$_2$Se gas (hydrogen selenide) or the like.

In this case, the flow rate of the introduced impurity gas is preferably selected to be less by, for example, $10^{-3}$ to $10^{-6}$ than those of the AsH$_3$ gas 9 and TMG gas 8, and the length of time of gas introduction is preferably selected to be about 0.5 to 10 sec so as to form a molecular epitaxial growth layer having a desired impurity concentration distribution in the thicknesswise direction. Further, it is apparent that, by suitably regulating the amount and duration of introduction of the impurity gases, it is possible to provide pn junctions, non-uniform impurity concentration distributions, bipolar transistor structures such as npn, npin, pnp and pnip structures, field effect transistor structures such as n$^+$in$^+$ and n$^+$ $^l$n$^-$ $^l$n$^+$ structures, electrostatic induction transistor structures, pnpn thyristor structures, etc.

Further, although not specifically described in the aforementioned embodiments, an optical system 30 may be mounted on the ellipsoidal mirror 16, and an external radiation source 31 such as a mercury lamp, a heavy hydrogen lamp, a xenon lamp, an excimer laser or an argon laser may be provided to direct radiation having a wavelength of 180 to 600 nm toward and onto the substrate 12. When such members are provided, the temperature of the substrate 12 can be decreased to cause growth of a single crystal having a higher quality. It is needless to mention that the present invention can exhibit the desired effect even in the absence of the combination of the optical system 30 and the radiation source 31.

The aforementioned embodiments have referred principally to the formation of a crystal growth layer of GaAs by way of example. However, it is apparent that the present invention is equally effectively applicable to the formation of III-V compounds including InP, AlP and GaP. The present invention is also applicable to the formation of mixed crystals such as Ga$_{(1-x)}$ Al$_x$As and Ga$_{(1-x)}$ Al$_x$As$_{(1-y)}$ P$_y$. Also, the material of the substrate is in no way limited to GaAs, and a substrate of any other compound semiconductor may be used for the growth of a hetero epitaxial layer.

Further, although the aforementioned embodiments have referred to the formation of a compound semiconductor by way of example, the present invention is in no way limited to the formation of such a specific semiconductor and is equally effectively and successfully applicable to the crystal growth of an element semiconductor of a single element such as that belonging to the IV group. In such a case, crystal growth can be attained by the combination of H$_2$ gas and reactive gas such as SiCl$_4$, SiHCl$_3$, SiH$_2$Cl$_2$ or like chloride, when the element semiconductor is silicon.

We claim:

1. An apparatus for forming a monocrystalline thin film of a compound or element semiconductor comprising;
   (a) a growth vessel including a transmission window for allowing the transmission of electromagnetic radiation from outside of said vessel to inside said vessel, said vessel enclosing a support means for supporting a substrate;
   (b) evacuating means for evacuating the interior of said growth vessel to an ultrahigh vacuum;
   (c) means for alternately introducing into the vessel at least first and second gaseous molecules, at least one of said first and second gaseous molecules containing an element of the semiconductor to be formed;
   (d) external infrared radiation emitting means for emitting infrared radiation toward and onto said substrate from outside said growth vessel through the transmission window;
   (e) a first filter means for passing infrared radiation emitted from said emitting means which has wavelengths less than a pre-selected wavelength, said first filter means being interposed between said substrate and said emitting means;
   (f) an external radiation pyrometer for detecting the temperature of said substrate from outside said growth vessel said pyrometer being along a direct line from the substrate to the outside of the vessel that avoids said first filter means;
   (g) a second filter means for passing radiation which has wavelengths longer than the pre-selected wavelength and interposed between said substrate and said pyrometer; and (h) substrate temperature control means for controlling the temperature of the substrate by controlling the output power of said external infrared radiation emitting means on the basis of a temperature feedback signal applied from said external pyrometer to said external infrared radiation emitting means.

2. An apparatus as claimed in claim 1 wherein said transmission window is comprised of a quartz plate forming the upper part of said growth vessel, and further including an external focusing means for focusing the infrared radiation from said infrared radiation emitting means through said quartz plate onto said substrate and which comprises an ellipsoidal focusing mirror which is disposed above and forms a closed volume with said quartz plate, and wherein the emitting means is located between the mirror and the quartz plate.

3. An apparatus as claimed in claim 2, further comprising an additional external radiation emitting means located outside said vessel and deposed independently of said infrared radiation means for emitting and directing radiation having a wave length ranging form about 180nm to about 600nm through said transmission window toward and onto said substrate as to enhance the reaction of gaseous molecules on said substrate surface, and decreasing the temperature to which the substrate is required to be heated.

4. An apparatus as in claim 1 wherein the support means is capable of supporting the substrate from a bottom surface thereof without bonding or mechanical affixing with an exposed surface of the substrate facing upwards.

5. An apparatus according to claim 1, wherein said substrate is supported on a support means of quartz.

6. An apparatus according to claim 1, wherein said first radiation filter shields said substrate from radiation having a wavelength longer than 3 um.

7. An apparatus according to claim 1, wherein said second radiation filter permits transmission of at least eighty percent of radiation having a wavelength up to about 4.5 $\mu$m.

8. An apparatus according to claim 1, wherein said radiation pyrometer is sensitive to radiation having a wavelength ranging from about 35 $\mu$m to about 4.5 $\mu$m.

9. An apparatus according to claim 1, wherein said first radiation filter is selected from the group consisting of quartz, glass, and both quartz and glass, and said second radiation filter is of sapphire.

10. An apparatus as in claim 1 further including means for introducing into the vessel at least third and fourth gaseous molecules.

11. An apparatus as claimed in claim 3 where in said additional external radiation means provides ultravcolet radition.

12. An apparatus for forming a monocrystalline thin film of a compound or element semiconductor comprising:

(a) a growth vessel including a transmission window for allowing the transmission of electromagnetic radiation from outside of said vessel to inside said vessel, said vessel enclosing a support means for supporting a substrate, said window comprising a quartz plate which forms the upper part of said growth vessel;

(b) evacuating means for evacuating the interior of said growth vessel to an ultrahigh vacuum;

(c) means for alternately introducing into the vessel at least first and second gaseous molecules, at least one of said first and second gaseous molecules containing an element of the semiconductor to be formed;

(d) external infrared radiation emitting means disposed above said growth vessel for emitting infrared radiation toward and onto said substrate, from outside said growth vessel and through said quartz plate;

(e) a first filter means for passing infrared radiation emitted from said emitting means which has wavelengths less than a pre-selected wavelength, said first filter comprising a plate interposed between said external infrared radiation emitting means and said quartz plate;

(f) an ellipsoidal reflection mirror located outside of the vessel and partially surrounding said external infrared radiation emitting means for focusing the infrared radiation emitted from said external infrared radiation emitting means through said plate and said quartz plate onto said substrate;

(g) an external radiation pyrometer for detecting the temperature of said substrate from outside said growth vessel;

(h) a second filter means for passing radiation which has wavelengths longer than the preselected wavelength, said second filter comprised of a sapphire glass in communication with the interior of said growth vessel and interposed between said external radiation pyrometer and said substrate; and (i) substrate temperature control means for controlling the temperature of the substrate by controlling the output power said external infrared radiation emitting means on the basis of a temperature feedback signal applied from said external radiation pyrometer to said external infrared radiation emitting means.

13. An apparatus according to claim 12, further including an additional external source of radiation for emitting and directing radiation having a wavelength from about 180nm to about 600nm, said additional source of radiation being located outside said vessel, and beyond said mirror and wherein said elliposoidal reflection mirror includes a window therein permitting passage there through of radiation directed from said addition external source of radiation toward and onto said substrate.

14. An apparatus according to claim 12, wherein said substrate is supported on a support means of quartz.

15. An apparatus according to claim 12, wherein said glass plate shields said substrate from radiation having a wavelength longer than 3 $\mu$m.

16. An apparatus according to claim 12, wherein said sapphire permits transmission of at least eighty percent of radiation having a wavelength up to about 4.5 $\mu$um.

17. An apparatus according to claim 12, wherein said radiation pyrometer is sensitive to radiation having a wavelength ranging from about 3.5 $\mu$m to about 4.5 $\mu$m.

18. An apparatus as in claim 12 further including means for introducing into the vessel at least third and fourth gaseous molecules.

* * * * *